United States Patent [19]

Clifton et al.

[11] 4,411,022
[45] Oct. 18, 1983

[54] INTEGRATED CIRCUIT MIXER APPARATUS

[75] Inventors: Brian J. Clifton, Sudbury, Mass.; Gary D. Alley, Londonderry, N.H.; Ralph A. Murphy, Hudson, Mass.

[73] Assignee: The United States of America as represented by the Secretary of the Air Force, Washington, D.C.

[21] Appl. No.: 343,034

[22] Filed: Jan. 27, 1982

[51] Int. Cl.$^3$ .............................................. H04B 1/26
[52] U.S. Cl. .................................... 455/327; 455/328; 455/330
[58] Field of Search .............................. 455/326–328, 455/330, 333

[56] References Cited

U.S. PATENT DOCUMENTS 3,678,395  7/1972  Hunton et al. ...................... 455/327
3,963,989  6/1976  Sellberg et al. ..................... 455/330

OTHER PUBLICATIONS

"Cooled Low Noise GaAs Monolithic Mixers at 110 GHz", by Clifton et al., Jun. 1981.

Primary Examiner—Jin F. Ng
Attorney, Agent, or Firm—Donald J. Singer; William Stepanishen

[57] ABSTRACT

An integrated circuit mixer which is impedance matched to a fundamental waveguide, utilizes a slot coupler and a coplanar transmission line to apply an RF and local oscillator signal to a Schottky-barrier diode. The IF signal which is available at the output of the Schottky-barrier diode is filtered by means of an RF bypass capacitor that is located on the dielectric substrate surface. At 110 GHz, a mixer module when mounted in the end of a waveguide horn, has an uncooled double-sideband (DSB) mixer noise temperature of 339° K. and conversion loss of 3.8 dB.

7 Claims, 7 Drawing Figures

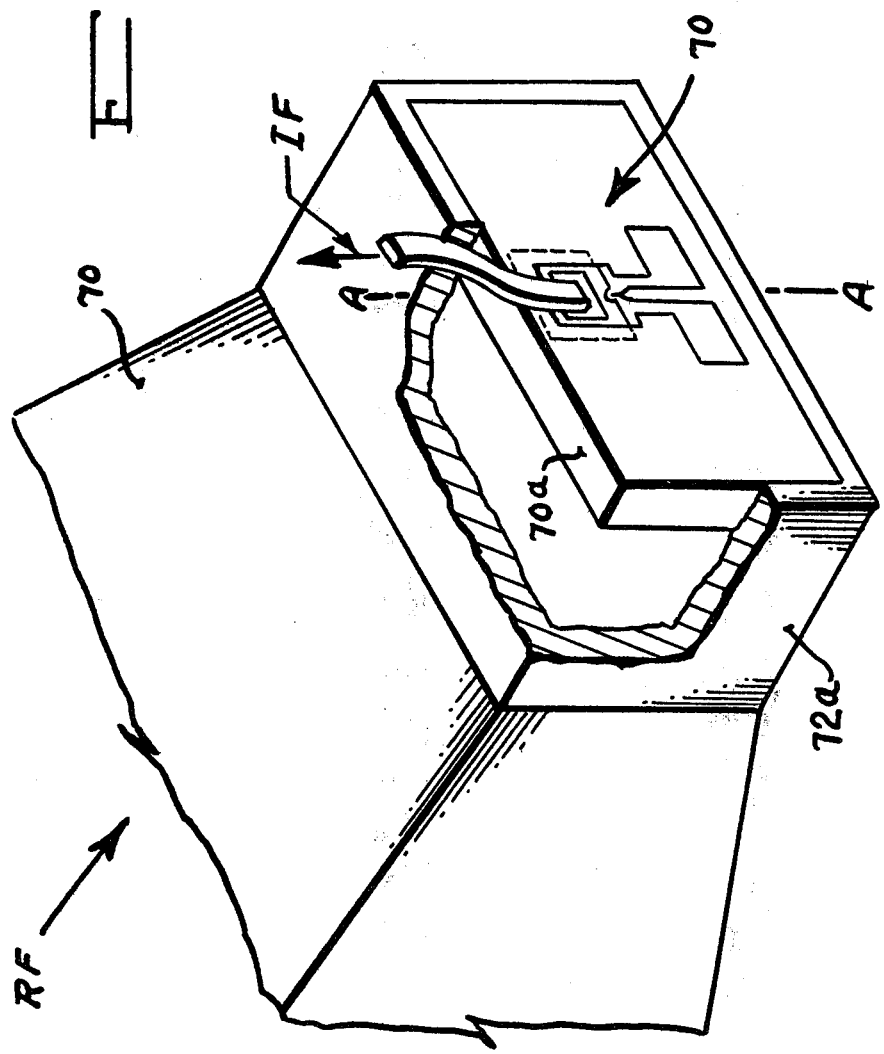

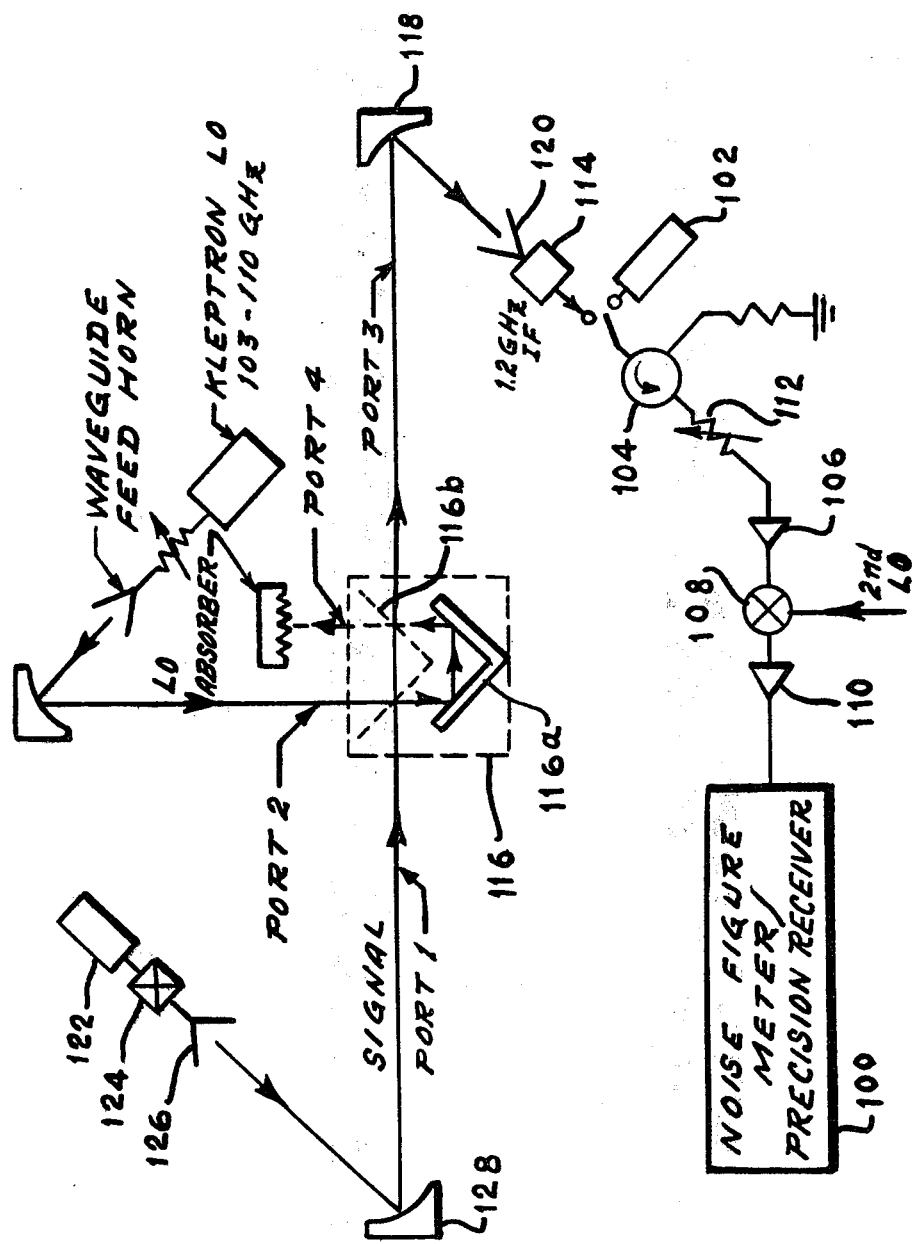

INTEGRATED CIRCUIT MIXER APPARATUS

STATEMENT OF GOVERNMENT INTEREST

The invention described herein may be manufactured and used by or for the Government for government purposes without the payment of any royalty thereon.

INTRODUCTION

Mixer is a device that has two or more signal inputs which are usually adjustable, and one common output. The mixer stage in a superheterodyne receiver combines the incoming modulated rf signal with the signal of a local rf oscillator to produce a modulated i-f signal. Crystal diodes are widely used as mixers in radar and other microwave equipment.

Many microwave radar superheterodyne receivers do not employ an RF amplifier. They simply use the crystal-mixer stage as the receiver front end. The noise figure of good crystal-mixer receivers is approximately 7 to 10 db over the range of radar frequencies. This is high compared with low-noise RF amplifiers. However, the noise figure of a crystal mixer is acceptable for many radar applications, especially where simplicity is an important consideration.

The purpose of the mixer portion of the superheterodyne receiver is to convert RF energy to IF energy. A crystal diode with nonlinear resistance characteristic is commonly used as the mixing element. A crystal mixer is broadband when the signal and image frequencies are both terminated in a matched load. The energy impressed in the RF signal channel of a broadband mixer is converted in equal portions to the IF signal and the image. Therefore the theoretical broadband conversion loss can never be less than 3 db. Shortcircuiting or open-circuiting the image termination results in a narrowband mixer. The conversion loss is less in the narrowband than in the broadband mixer.

There is considerable interest in high-performance mixers and receivers for the microwave, millimeter, and submillimeter-wave regions which will also be rugged, reliable, and can be mass produced at low cost. Applications range from radio astronomy to large military imaging systems. Since the packaging of existing high-performance mixers using whisker-contacted Schottky-barrier diodes is quite labor intensive, they are expensive and time consuming to produce. At frequencies above 100 GHz, conventional waveguide mixer circuits become increasingly difficult to make, losses increase rapidly, and circuit elements are located at electrically long distances from the diode leading to large and uncontrolled parasitic elements. Monolithic integration allows circuit elements to be located electrically close to the Schottky diode so that circuit losses are reduced and parasitic elements can be controlled. Moreover, novel coupling and impedance-matching configurations are made possible by using the precision of photolithographically defined circuit elements. A monolithic mixer that is easy to assemble, has the potential for low-cost mass production.

SUMMARY OF THE INVENTION

The present invention utilizes a dielectric substrate as a base for an integrated circuit mixer apparatus which uses a slot coupler in conjunction with a Schottky-barrier diode to provide the mixer function. An RF signal and a local oscillator signal are applied through a waveguide horn or $TE_{10}$ waveguide to the dielectric substrate. A slot coupler couples the input signals through a coplanar transmission line to the Schottky-barrier diode. A bypass capacitor is connected between the mixer output and ground to remove any RF energy from the IF output signal.

It is one object of the present invention, therefore, to provide an improved integrated circuit mixer apparatus.

It is another object of the invention to provide an improved integrated circuit mixer apparatus wherein precisely-formed circuit elements are located electrically close to the Schottky diode.

It is another object of the invention to provide an improved integrated circuit mixer apparatus wherein circuit losses due to parasitic elements are controlled and reduced.

It is still another object of the invention to provide an improved integrated circuit mixer apparatus wherein a slot coupler is utilized to couple an RF and local oscillator signal to the mixer.

It is yet a further object of the invention to provide an improved integrated circuit mixer apparatus wherein an integrated coplanar transmission line provides impedance matching between the input signal and the Schottky diode.

It is still another object of the invention to provide an improved integrated circuit mixer apparatus which is economical to produce and utilizes conventional, currently available components that lend themselves to standard mass production manufacturing techniques.

These and other advantages, objects and features of the invention will become more apparent after considering the following description taken in conjunction with the illustrative embodiment in the accompanying drawings.

BRIEF DESCRIPTION OF THE DRAWINGS

FIG. 5 is a pictorial view, partially in section, of the integrated circuit mixer apparatus mounted in a waveguide horn;

FIG. 7 is a block diagram of a quasi-optical receiver test set up to perform noise-figure and conversion-loss measurements for the integrated circuit mixer apparatus.

DESCRIPTION OF THE PREFERRED EMBODIMENT

Figure 1:
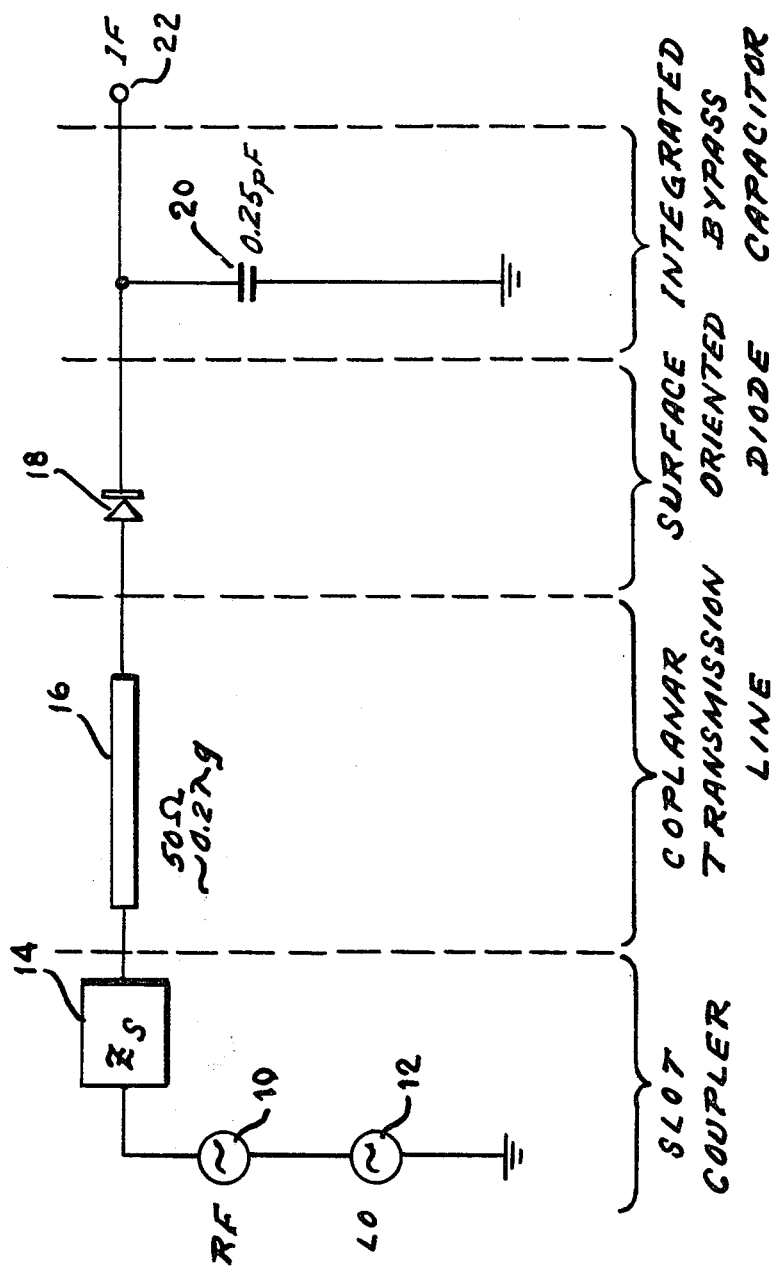
FIG. 1 is a schematic diagram of the integrated circuit mixer apparatus according to the present invention.

Referring now to FIG. 1, there is shown a schematic diagram of the integrated circuit mixer apparatus wherein the input signal which comprises an RF and a local oscillator signal are represented respectively by an RF generator 10 and a local oscillator 12. The local oscillator and RF signals are applied to a slot coupler unit which is shown schematically as Zs in block 14. A coplanar transmission line 16 which has the characteristics of 50 ohms impedance and a length of approximately 0.2 $\lambda g$ as shown in the figure, applies the input signal to the Schottky-barrier diode 18. The cathode of the Schottky diode 18 is directly connected to the IF output terminal 22. A bypass capacitor 20 is connected between the IF output terminal 22 and ground.

Figure 2:
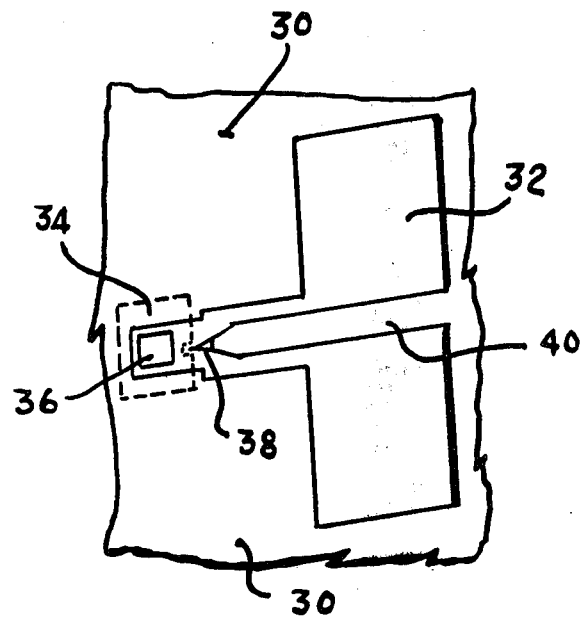
FIG. 2 is a top pictorial view of the integrated circuit mixer apparatus.

In FIG. 2, there is shown a top pictorial view of the integrated circuit mixer apparatus in which the gold ground plane 30 outlines and defines the slot coupler 32. The peripheral bypass capacitor 34 is defined by the outline of one of the plates that form the capacitor. The bonding pad 36 which is the IF output terminal is positioned adjacent to the cathode of the Schottky diode 38. The coplanar transmission line 40 is connected to the anode of the Schottky diode 38.

Figure 3:
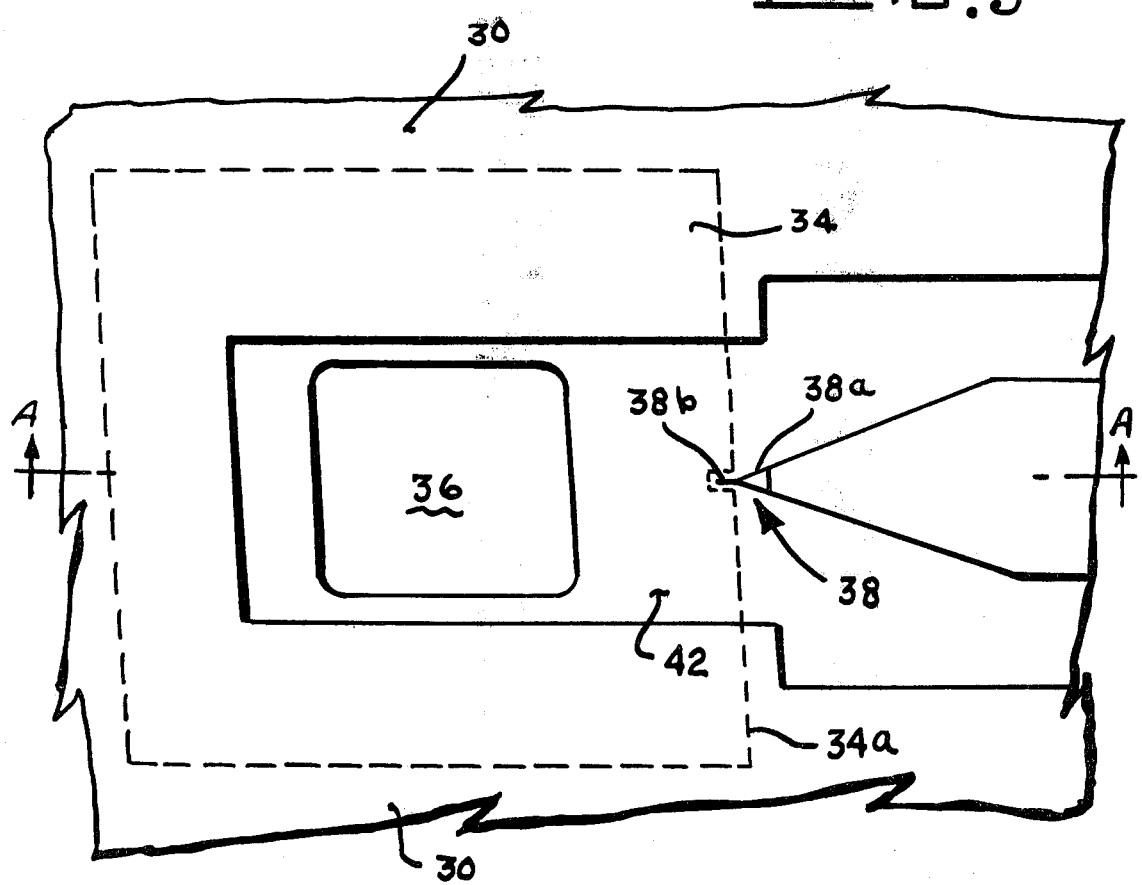
FIG. 3 is a top pictorial view of the integrated circuit mixer apparatus enlarged to show greater detail.

In FIG. 3, there is shown in enlarged detail the coplanar transmission line 40 which is connected directly to the anode 38a of the Schottky-barrier diode 38. The cathode 38b of the Schottky diode is shown extending from the anode 38a and is also defined by the outline of the buried plate of the peripheral bypass capacitor 34. The ohmic contact pad 36 is shown surrounded by the peripheral bypass capacitor 34. The peripheral bypass capacitor 34 is formed by a first capacitor plate 34a which is buried beneath an insulating layer 42 and a second capacitor plate which is defined in the surface ground plane 30 by the first capacitor plate 34a. The insulating layer 42 extends just beyond the periphery of the first capacitor plate 34a and may extend beneath all portions of the surface ground plane 30. The bonding pad 36 is surrounded by the insulating layer 42 and is connected to the portion of first capacitor plate 34a as defined by the shape of bonding pad 36.

The coupling of millimeter-wave radiation into the mixer diode is a critical aspect of the design of an integrated circuit mixer. It must be performed with low loss by a structure which is electrically small. In the present mixer apparatus, the input radiation (both the RF and local oscillator signals) propagates through the dielectric substrate to a slot coupler which is fabricated photolithographically in a metallic ground plane on the surface of the dielectric substrate. The slot coupler is connected to a Schottky diode by an appropriate section of coplanar line, and a bypass capacitor completes the mixer circuit by providing a short circuit to millimeter-wave frequencies and an open circuit at the IF frequencies. The heart of the integrated-circuit mixer is the Schottky-barrier diode which is formed on material having epitaxial layers of n on n+-GaAs located upon a dielectric substrate.

Figure 4:
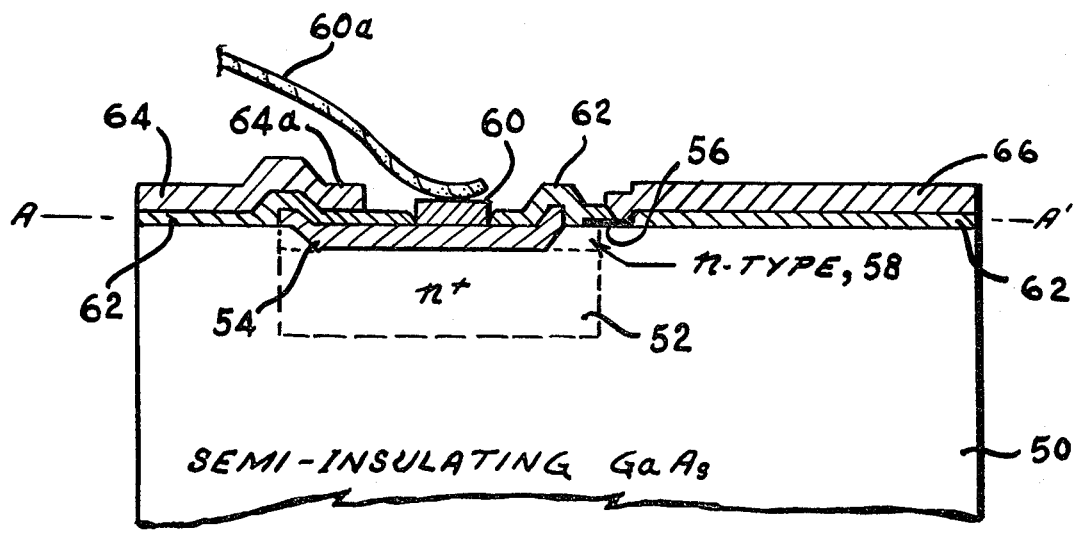
FIG. 4 is a cross-sectional view of the integrated circuit mixer apparatus taken along line A—A' of FIG. 3.

There is shown in FIG. 4 a cross sectional view taken through the mixer of FIG. 3 along line A—A' which indicates the main fabrication and topological details of the mixer apparatus. A semi-insulating substrate 50 which may comprise any suitable material such as silicon, gallium arsenide, alumina ceramic, quartz or sapphire. However, in the present example, a substrate of GaAs is provided as a base in which an n+-GaAs layer 52 is grown. A first capacitor plate 54 is formed in electrical contact with the n+-GaAs layer 52. A Schottky-barrier diode 56 is formed on the surface of the semi-insulating substrate 50. A region of n-type material 58 is formed between a portion of the Schottky diode 56 and the n+-GaAs layer 52. A bonding pad 60 is provided on the surface of an in electrical contact with the first capacitor plate 54. A gold ribbon 60a is connected by any suitable conventional means to bonding pad 60. An insulating layer 62 of $SiO_2$ is deposited over the first capacitor plate 54, and a portion of the Schottky diode 56 and may extend over the substrate 50. A gold ground plane 64 is deposited on the insulating layer 62 and over the substrate 50. The coplanar transmission line 66 is formed in the gold ground plane by photolithographic technique and is in electrical contact with the anode portion of the Schottky diode 56.

The integrated circuit mixer apparatus is fabricated in the following manner. A semi-insulating GaAs substrate 50 has an n+ layer 52 formed therein. The n+ layer 52 is approximately 3 $\mu$m thick with a carrier concentration of $3 \times 10^{18}$ cm$^{-3}$ while the n layer 58 is 0.1-0.2 $\mu$m thick with a concentration $0.8-2 \times 10^{17}$ cm$^{-3}$. The diode ohmic contact region which is the boundary area between the n+ layer 52 and the first capacitor plate 54, is defined on the surface of the n+-GaAs by etching away and n layer and alloying an evaporated Au-Ge ohmic-contact metallization (first capacitor plate 54) into the n+ layer 52. The Schottky-barrier metallization 56 is a stripe of Ta-Au material which is defined on the surface of the n-GaAs substrate 50 by using optical projection lithography and metallization liftoff. After a layer 62 of $SiO_2$ is deposited over the entire surface and the device areas are protected, proton bombardment is used to isolate the diode conducting area by converting the unprotected epitaxial layers to high-resistivity material. The Schottky-barrier metallization stripe 56 is contacted through an opening in the $SiO_2$ layer with a final overlay circuit metallization that forms the coplanar transmission line 66 and also forms the bypass capacitor (the second capacitor plate 64a) around the periphery of the ohmic contact. The second capacitor plate 64a comprises that portion of the gold ground plane 64 which is defined by the outline (as seen in the top view of FIGS. 2, 3 and labelled 34) of the first capacitor plate 54.

Thinning the GaAs substrate 50 and sawing the wafer to separate the individual integrated mixer modules completes the fabrication. In FIG. 5, there is shown a mixer module 70 which is mounted in a $TE_{10}$ waveguide horn 72. The module dimensions are chosen to be slightly less than the inside dimensions of $TE_{10}$ waveguide and the module thickness is chosen to be thin enough to raise any undesired resonance above the frequency range of the mixer operation. This resonance may occur when the width of the GaAs substrate 70a, which is perpendicular to the E-field in the $Te_{10}$ waveguide 72, is equal to 1.5 $\lambda_g$ for a TM surface wave propagating on the GaAs surface when it is positioned inside the rectangular metallic guide 72a.

Figure 6:
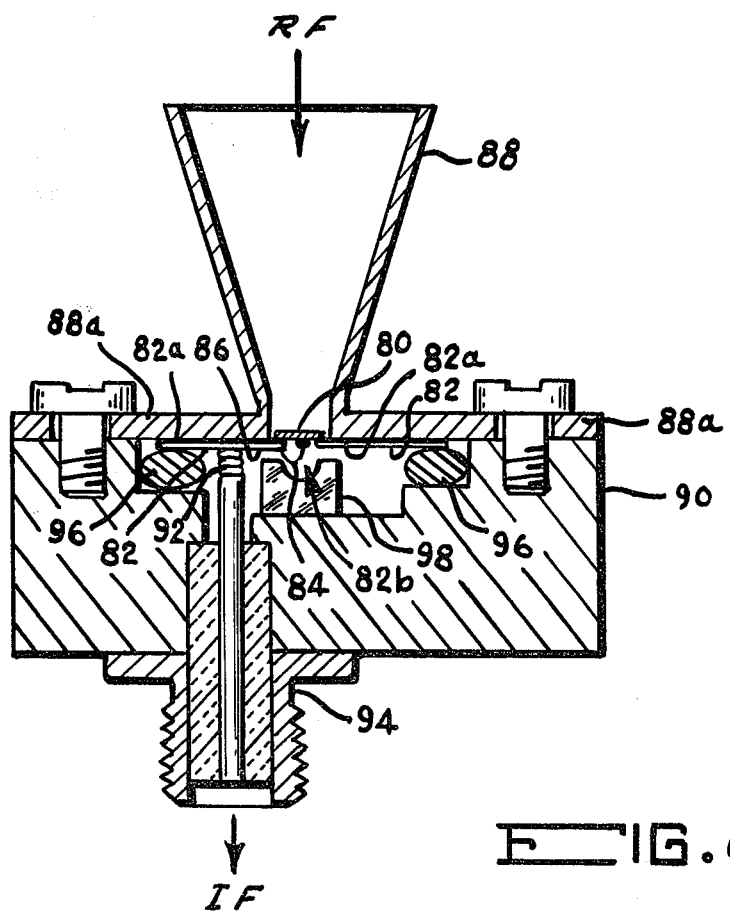
FIG. 6 is a cross-sectional view of the integrated circuit mixer apparatus in a mixer mounting block.

Although each module is a complete integrated mixer the mixer module 80 is inconveniently small in chip form, and is mounted in a larger structure for use as shown in FIG. 6. The overlay circuit ground-plane metallization on the chip 80 is alloy bonded to a ground-plane metallization 82a on the back surface of a ceramic substrate 82 so that the integrated-circuit metallization as seen in FIG. 2 is accurately positioned over a hole 82b which is drilled through the ceramic substrate 82. One end of a gold ribbon 84 is inserted into the hold 82b in the ceramic substrate 82 and is bonded to the ohmic-contact pad on the mixer 80 and the other end of the ribbon 84 is bonded to a 50 ohm microstrip line 86 which is defined on the front surface of the ceramic substrate 82. The integrated mixer module 80 is located in the end of a standard $TE_{10}$ waveguide horn 88 which is mounted by any suitable conventional means to a mixer mounting block 90. A bellows spring-contact 92 which is connected to the microstrip line 86 on the ceramic substrate 82, provides an IF output connection to an SMA connector 94. The O-ring spring 96 presses the ceramic substrate ground-plane metallization 88a into intimate contact with the flange surface of the waveguide horn 88 to provide a low-loss RF contact. The mixer mounting block 90 is rugged and mechanically simple. The slot coupler on the back surface of the dielectric couples 88 percent of the power indicent on the dielectric to the Schottky diode and the remaining 12 percent is radiated from the slot coupler through the hole 82b in the ceramic substrate 82 in a widely diverging beam. However, there is shown in position below the hold 82b, an optional quasi-optical spherical reflector 98 which may be utilized to backstop and thereby recover some of the power that is lost. Measurements were made on a frequency-scaled model of the mixer which indicate that a quasi-optical spherical reflector 98 can refocus the power transmitted through the hole 82b back into the slop coupler on the mixer module 80 thereby giving about 1-dB improvement in conversion loss. The quasi-optical reflector 98 is electrically isolated from the RF circuit, is very wide band, and does not exhibit the losses normally associated with a waveguide backshort.

The mixer module provides an impedance match to a $TE_{10}$ wave propagating in a fundamental waveguide. Therefore, the mixer module can be mounted in a full-height $TE_{10}$ waveguide and interfaced directly to any conventional waveguide component. For example, a pair of mixer modules mounted on the appropriate ports of a waveguide magic-T with an appropriate IF combining network would produce a balanced mixer. At millimeter wave frequencies (about 94 GHz) and at submillimeter wave frequencies, it would be more appropriate to use a totally monolithic approach in which a semi-insulating dielectric material is used at the support for a surface-oriented diode fabricated on semiconducting layers grown or deposited on the surface of the semi-insulating dielectric. At centimeter wavelengths a hybrid approach combining a discrete diode or diodes attached to an integrated circuit patterned on the dielectric material may be applied. A quasi-optical approach and a single-ended double-sideband (DSC) receiver configuration may be utilized to evaluate the mixer so that the complete receiver can be scaled to higher frequencies, where waveguide techniques are inappropriate. the dielectric substrate to the slot coupler on the back surface. Low-loss beam optics and a quasi-optical diplexer 116 which comprises a mirror 116a and a beamsplitter 116b are used to combine signal and local-oscillator energy into a single beam and an off-axis parabolic mirror 118 is used to focus the beam energy into the waveguide horn 120. The noise measurement is performed by using a calibrated noise tube 122 and ferrite modulator 124 which is attached to a scalar feed horn 126 that is aligned with the focus of another off-axis parabolic mirror 128. Since IF responses from both upper and lower signal sidebands are thus obtained only DSB parameters are measured. Measurement of the system Y-factor as a function of IF noise figure allows precise calculation of both the DSB mixer noise temperature and conversion loss.

Typical parameters obtained for a stripe geometry surface-oriented Schottky-barrier diode in the mixer are zero-bias junction capacitance $C_j = 5-7$ fF, dc series resistance $R_s = 7$ ohms, and ideality factor $n = 1.10$, yielding a zero-bias cutoff frequency in the range of 3200–4500 GHz. The breakdown voltage typically is 10 V. In a surface-oriented diode, the current is constrained even at low frequencies to flow along the surface of the device in the thin epitaxial layers. Thus little redistribution of the current density occurs as the frequency increases and little change in effective series resistance occurs from dc to millimeter-wave frequencies. At 110 GHz, an uncooled DSB noise temperature of 339° K. and mixer conversion loss of 3.8 dB have been measured from an IF frequency of 1.2 GHz. The mixer has an inherently larger RF bandwidth and gives excellent performance over the waveguide band. RF tuning is not necessary. Instantaneous bandwidth is determined by the IF matching network-IF amplifier combination. Scale model results shown that IF bandwidths greater than 6 GHz are obtainable.

Although the invention has been described with reference to a particular embodiment, it will be understood to those skilled in the art that the invention is capable of a variety of alternative embodiments within the spirit and scope of the appended claims.

What is claimed is:

1. An integrated circuit mixer apparatus comprising in combination:
    a dielectric substrate having a top and bottom surface, said dielectric substrate including a ground plane on said top surface,
    a slot coupler means formed on the top surface of said dielectric substrate,
    a coplanar transmission line means disposed on said top surface of said dielectric substrate, said coplanar transmission line means being electrically connected to said slot coupler means,
    a Schottky-barrier diode located on said top surface of said dielectric substrate, said Schottky-barrier diode having an anode and a cathode, said anode of said Schottky-barrier diode being connected by said coplanar transmission line to said slot coupler means,
    a bypass capacitor located on said top surface of said dielectric substrate, one plate of said bypass capacitor being electrically connected to the cathode of said Schottky-barrier diode, the other plate of said bypass capacitor being electrically connected to a portion of said ground plane, and,
    a bonding pad attached to said first capacitor plate to provide an IF signal output terminal, an RD signal and a local oscillator signal being applied to said dielectric substrate, said RF signal and said local oscillator signal propagating through said dielelectric substrate to said slot coupler means and by means of said coplanar transmission line means to said Schottky-barrier diode, an IF signal appearing in response to said RF and local oscillator signal at said If signal output terminal.

2. An integrated circuit mixer apparatus as described in claim 1 further including a waveguide horn to receive said RF and said local oscillator signal, said dielectric substrate being mounted at one end of said waveguide horn, said bottom surface of said dielectric substrate positioned to receive said RF and said local oscillator signal.

3. An integrated circuit mixer apparatus as defined in claim 2 wherein said waveguide horn comprises a $TE_{10}$ waveguide horn.

4. An integrated circuit mixer apparatus as described in claim 1 wherein said dielectric substrate comprises semi-insulating GaAs.

5. An integrated circuit mixer apparatus as described in claim 1 wherein said coplanar transmission line has a length on the order of 0.2 $\lambda_g$, where $\lambda_g$ is the wavelength of the applied RF signal.

6. An integrated circuit mixer apparatus as described in claim 1 wherein said Schottky-barrier diode is surface-oriented and is formed on epitaxial layer of n material on an $n^+$-GaAs layer which is grown on said dielectric substrate.

7. An integrated circuit mixer apparatus as described in claim 6 wherein said $n^+$ layer is approximately 3 $\mu$m thick with a carrier concentration of $3 \times 10^{18}$ cm$^{-3}$ while n layer is 0.1–0.2 $\mu$m thick with a concentration $0.8$–$2 \times 10^{17}$ cm$^{-3}$.

* * * * *